(12) United States Patent
Côté et al.

(10) Patent No.: US 12,261,139 B1
(45) Date of Patent: Mar. 25, 2025

(54) MANAGING STRESS IN SEMICONDUCTOR CHIPS

(71) Applicant: Ciena Corporation, Hanover, MD (US)

(72) Inventors: Jean-Sébastien Côté, Québec (CA); Vincent Bélanger, Québec (CA)

(73) Assignee: Ciena Corporation, Hanover, MD (US)

( * ) Notice: Subject to any disclaimer, the term of this patent is extended or adjusted under 35 U.S.C. 154(b) by 34 days.

(21) Appl. No.: 18/591,926

(22) Filed: Feb. 29, 2024

(51) Int. Cl.
- *H01L 25/16* (2023.01)
- *H01L 21/48* (2006.01)
- *H01L 23/00* (2006.01)

(52) U.S. Cl.
CPC .......... *H01L 24/16* (2013.01); *H01L 21/4853* (2013.01); *H01L 25/167* (2013.01); *H01L 2224/16145* (2013.01); *H01L 2224/16225* (2013.01); *H01L 2924/351* (2013.01)

(58) Field of Classification Search
None
See application file for complete search history.

(56) References Cited

U.S. PATENT DOCUMENTS

| | | | | |
|---|---|---|---|---|
| 7,091,619 B2 * | 8/2006 | Aoyagi | ............. | H01L 23/49816 257/E25.023 |
| 2011/0233771 A1 * | 9/2011 | Kwon | ............... | H01L 23/49816 257/737 |
| 2014/0175637 A1 * | 6/2014 | Stuber | ................. | H01L 25/0657 257/737 |
| 2014/0291843 A1 * | 10/2014 | Jiang | ................. | H01L 23/49816 257/738 |
| 2015/0001740 A1 * | 1/2015 | Shi | ........................... | H01L 24/14 257/784 |
| 2015/0171028 A1 * | 6/2015 | Jo | ....................... | H01L 25/0657 257/713 |
| 2016/0233198 A1 * | 8/2016 | Stuber | ..................... | H01L 21/78 |
| 2016/0358891 A1 * | 12/2016 | Geissler | ................ | H01L 21/486 |

OTHER PUBLICATIONS

Valery V. Felmetsger, "Stress Control in Multi-Layer Backside Metalization of Thinned Wafers.", Semiconductor International, 7 pgs, Oct. 1999, URL: https://www.researchgate.net/publication/236008221_Stress_Control_in_Multi-Layer_Backside_Metalization_of_Thinned_Wafers.

\* cited by examiner

*Primary Examiner* — Bilkis Jahan
(74) *Attorney, Agent, or Firm* — Young Basile Hanlon & MacFarlane, P.C.

(57) ABSTRACT

A first chip comprises a first set of one or more metal layers having a first thickness and comprising at least one metal layer that has a first CTE. A first volume of the first chip is adjacent to the first set of one or more metal layers. A second volume of the first chip comprises one or more electronic or photonic structures, and a second set of one or more metal layers that has a second thickness at least twice as large as the first thickness. At least one metal layer in the second set has a second CTE. A set of one or more metal structures of the first chip is adjacent to the second volume and comprises at least one metal structure electrically connected to at least a portion of at least one metal layer in the second set of one or more metal layers.

20 Claims, 11 Drawing Sheets

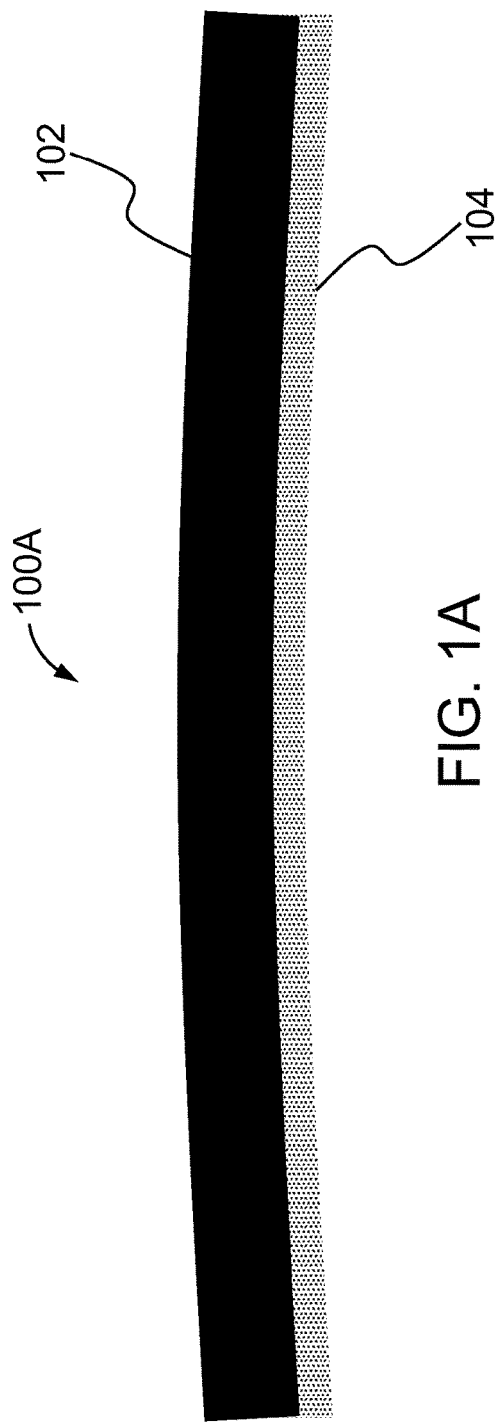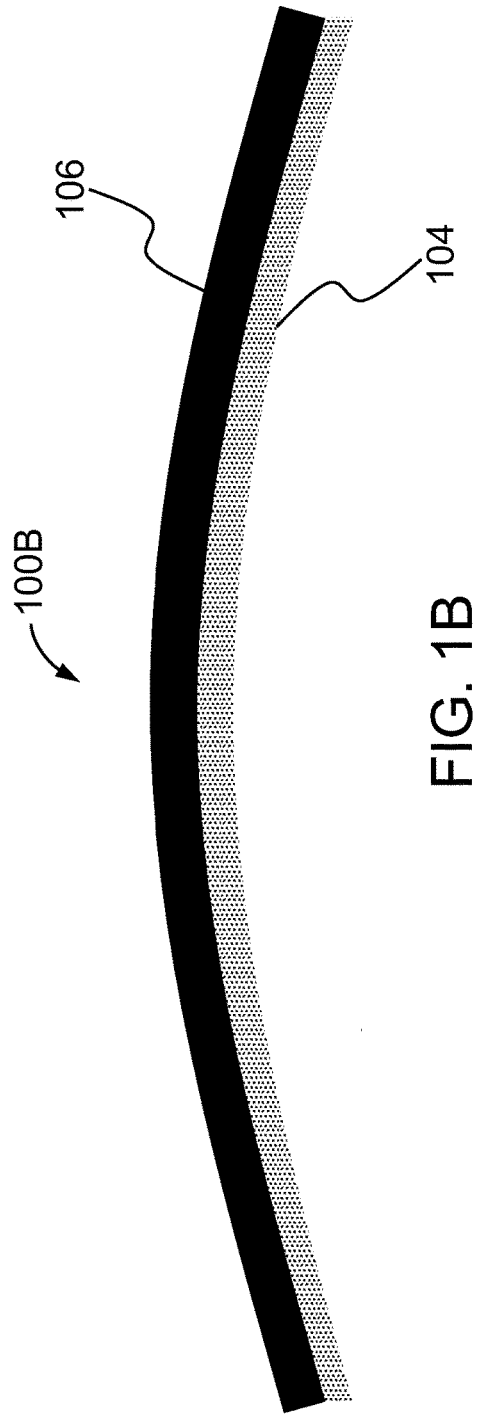

MANAGING STRESS IN SEMICONDUCTOR CHIPS

TECHNICAL FIELD

This disclosure relates to managing stress in semiconductor chips.

BACKGROUND

Complementary metal-oxide-semiconductor (CMOS) processes and other fabrication techniques can be used to fabricate electronic integrated circuits (EICs) that operate using electrical signals (e.g., voltage signals and/or current signals). Similar fabrication techniques can be used to fabricate photonic integrated circuits (PICs) in a silicon photonic platform or in other integrated photonic platforms. A silicon on insulator platform is an example of a silicon photonic platform that can be used to make opto-electrical active devices, optical passive devices, and optical waveguides in a silicon layer. In a silicon on insulator platform, the optical signals can be transmitted by optical waveguides and can be confined within the silicon layer, for example, because there is an underlying buried oxide (BOX) layer made up of thermal silicon dioxide (i.e., silicon oxidized using a thermal process) and an overlying silicon dioxide cladding surrounding the silicon layers. In such examples, the index contrast between the high index of refraction of silicon and the low index of refraction of silicon dioxide can be responsible for the confinement. Some advantages of silicon photonic platforms are the ability to make both active and passive devices, and the ability to make compact PICs due to the high index contrast between silicon and silicon dioxide.

SUMMARY

In one aspect, in general, an apparatus comprises: a first set of one or more metal layers of a first chip, where the first set of one or more metal layers has a first thickness and comprises at least one metal layer that has a first coefficient of thermal expansion; a first volume of the first chip, where the first volume is adjacent to the first set of one or more metal layers; a second volume of the first chip, where the second volume comprises one or more electronic or photonic structures, and a second set of one or more metal layers that has a second thickness that is at least twice as large as the first thickness, where at least one metal layer in the second set of one or more metal layers has a second coefficient of thermal expansion; and a set of one or more metal structures of the first chip, where the set of one or more metal structures is adjacent to the second volume and comprises at least one metal structure that is electrically connected to at least a portion of at least one metal layer in the second set of one or more metal layers.

Aspects can include one or more of the following features.

The second coefficient of thermal expansion is different from the first coefficient of thermal expansion.

The second coefficient of thermal expansion is no larger than half as large as the first coefficient of thermal expansion.

The electronic structures or photonic structures comprise at least one of a metallic waveguide, an optical waveguide, or a portion of an electro-optic device.

The apparatus further comprises one or more passivation layers or one or more adhesion layers located between the first set of one or more metal layers and the first volume.

At least one of (1) the first thickness or (2) the first coefficient of thermal expansion depends at least in part on at least one of (1) the second thickness or (2) the second coefficient of thermal expansion.

A first location of the first set of one or more metal layers depends at least in part on a second location of the second set of one or more metal layers.

The apparatus further comprises a second chip adjacent to the set of one or more metal structures and electrically connected to at least one metal structure in the set of one or more metal structures.

The second chip is electrically connected to at least one metal structure by electrically conductive solder.

The first volume comprises one or more materials including at least one semiconductor material.

The first set of one or more metal layers is electrically isolated from the second set of one or more metal layers and from the set of one or more metal structures.

In another aspect, in general, a method comprises: forming a first set of one or more metal layers adjacent to a first volume of a first chip, where the first set of one or more metal layers has a first thickness and comprises at least one metal layer that has a first coefficient of thermal expansion; forming a second volume of the first chip, where the second volume comprises one or more electronic or photonic structures, and a second set of one or more metal layers that has a second thickness, where at least one metal layer in the second set of one or more metal layers has a second coefficient of thermal expansion; and forming a set of one or more metal structures of the first chip, where the set of one or more metal structures is adjacent to the second volume and comprises at least one metal structure that is electrically connected to at least a portion of at least one metal layer in the second set of one or more metal layers.

Aspects can include one or more of the following features.

The method further comprises modifying a curvature of an outer surface of the first chip by heating at least a portion of the first chip from a first temperature to a second temperature, where the modifying of the curvature is based at least in part on the first coefficient of thermal expansion, the second coefficient of thermal expansion, and a temperature difference between the first temperature and the second temperature.

The second temperature is greater than or equal to 50 degrees Celsius.

The second temperature is greater than or equal to 200 degrees Celsius.

The first chip has a first curvature at the first temperature and has a second curvature at the second temperature, and the second curvature is smaller in magnitude than the first curvature.

The method further comprises applying electrically conductive solder to at least one of (1) a portion of the set of one or more metal structures or (2) a portion of an outer surface of a second chip; and placing a portion of the set of one or more metal structures of the first chip in contact with a portion of an outer surface of the second chip.

The second temperature is based at least in part on a melting point of the electrically conductive solder.

A first contact surface area between the first chip and the second chip before the heating is less than a second contact surface area between the first chip and the second chip after the heating.

The method further comprises performing backside grinding to form the first volume after forming the second volume.

The second thickness is at least twice as large as the first thickness.

The second coefficient of thermal expansion is no larger than half as large as the first coefficient of thermal expansion.

Aspects can have one or more of the following advantages.

The techniques and devices disclosed herein include semiconductor chips (herein referred to simply as "chips") comprising integrated circuits (ICs) and backside layers (BLs) that can manage stress and increase thermal stability of at least a portion of the chip. By increasing the thermal stability of the chip, BLs can remove or reduce the necessity of applying pressure to the chip during reflow soldering, for example. Since thinner chips can be more susceptible to warpage, implementing BLs on thinner chips can be particularly effective in reducing such warpage and allowing for a more compact design compared to thicker chips.

In some examples, the BLs comprise fiducials (also referred to as fiducial markers) that can be used to provide quick and accurate information associated with the location and orientation of the chip, thereby rendering subsequent die attachment (e.g., in a flip chip process, also known as controlled-collapse chip connection, or its abbreviation, C4, for electrically coupling two chips or a chip to a chip carrier) and inspection processes more efficient and precise. BLs can also improve the number and quality of solder joints formed between two chips. The addition of BLs to a chip can increase the known good die yield of dies produced from the process of dicing a wafer into multiple dies (e.g., by resulting in an increased percentage of dies that are successfully attached utilizing a flip chip process). In some examples, BLs can improve the long-term reliability of chips and their corresponding ICs by reducing static stress and/or stress induced by changes in temperature and in the environment (e.g., humidity).

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIG. 1A is a schematic diagram of an example chip.

FIG. 1B is a schematic diagram of an example chip.

DETAILED DESCRIPTION

Figure 2A:
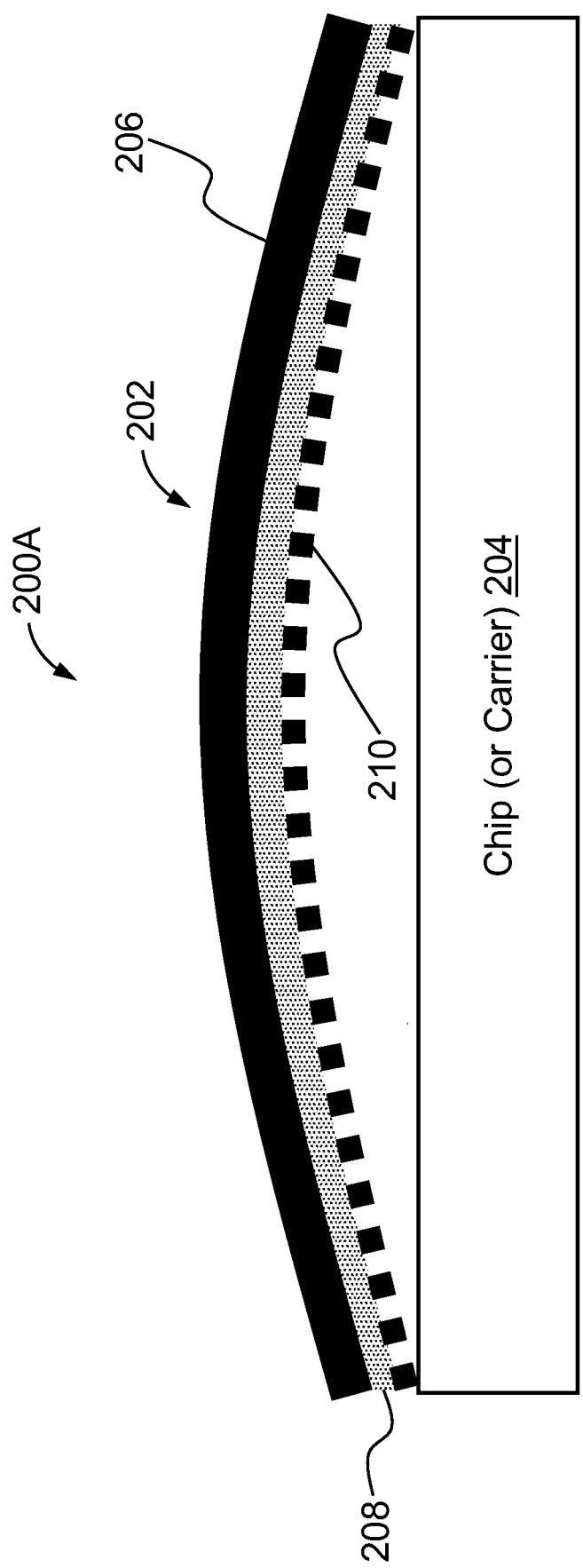
FIG. 2A is a schematic diagram of an example flip chip processing step.

The techniques and devices disclosed herein include semiconductor chips (herein referred to simply as "chips") that comprise one or more backside layers (BLs) and one or more integrated circuits (ICs), such as electronic integrated circuits (EICs) and photonic integrated circuits (PICs). The utilization of BLs can provide control over the stress and shape of a chip (e.g., the spatial profile of a surface of the chip) by modifying the stress applied to at least a portion of the chip (e.g., when the chip is at a static temperature, or when the chip is undergoing a change in temperature). As used herein, a "chip" can refer to an individual die (e.g., after a wafer has been diced into multiple dies) or a wafer that has not yet been diced into multiple dies.

In some examples, BLs enable a reduction in the variation of the height of one or more surfaces of the chip (also referred to as warpage). In chips that do not comprise BLs, such variations of the height may be larger after a thinning process (e.g., backside grinding) is performed and can be on the order of several microns, for example. In some applications, it can be challenging to utilize a thicker chip (e.g., a chip that has not undergone a thinning process), for example due to limitations inherent to the scribe and break process utilized in fabrication, or due to the space available in the packaging design of the chip. Therefore, in examples where a chip has a relatively thin backside (e.g., a thin handle), BLs may be particularly suited for reducing variation of the height of one or more surfaces of the chip. Furthermore, BLs can reduce the sensitivity of the chip to warpage induced by changes in temperature that may occur during some fabrication processes or during usage of the chip. In some examples, BLs can be designed as a stack of materials (e.g., formed by thin film deposition) on the backside of the chip so as to increase mechanical stability (e.g., by modifying stresses within the chip at a static temperature) and thermal stability of the chip (e.g., by modifying stresses within the chip during changes in temperature).

During fabrication at a foundry, the stress that a chip undergoes may be managed such that the warpage of the chip is reduced, or that the chip achieves a flatter spatial profile of a surface of the chip. Gaining control over such stress can result in better fabrication control of the optical properties of the chip, which can be modified by stress. In some cases, chips may undergo a thinning process (e.g., backside grinding) that is performed at the wafer level. In such a case in which the chip is a wafer that is then diced into multiple dies, each die can be impacted by the shape of the wafer (e.g., the warpage of the chip) acquired during the fabrication of the wafer. In general, a chip comprises one or more electronic structures (e.g., metal traces or metallic waveguides) and/or photonic structures (e.g., optical waveguides or electro-optic devices) that can impact the stress and shape of the chip. For example, a spatially asymmetric distribution of electronic or photonic structures can result in asymmetric stresses within the chip that lead to asymmetric warpage (i.e., an asymmetric shape of the chip). Furthermore, such asymmetry may also induce thermal dependencies on the warpage of the chip that may be undesirable.

FIGS. 1A, 1B, 2A, and 2B collectively show an example flip chip attachment process of a thinned chip that does not comprise BLs, while FIGS. 1A, 1B, 3A, and 3B collectively show an example flip chip attachment process of a thinned chip that comprises BLs.

FIG. 1A shows an example chip 100A comprising a first volume 102 (e.g., comprising a silicon handle or an indium phosphide handle) and a second volume 104 (e.g., comprising one or more photonic structures and one or more metal layers). In this example, there is some modest curvature of the chip 100A that has been acquired during fabrication of the structures in the second volume 104.

FIG. 1B shows an example chip 100B comprising a thinned first volume 106 (e.g., formed by performing backside grinding of the first volume 102 shown in FIG. 1A) and the second volume 104. In this example, a first curvature of the chip 100B is larger than a second curvature of the chip 100A shown in FIG. 1A due to the differences in stress associated with the thinned first volume 106 and stress associated with the first volume 102 shown in FIG. 1A.

FIG. 2A shows an example flip chip processing step 200A, prior to reflow soldering, where a first chip 202 is in contact with a second chip (or carrier) 204. The first chip 202 comprises a thinned first volume 206, a second volume 208, and metal structures 210. The first chip 202 may be formed, for example, by adding metal bumps (e.g., composed of copper) to the chip 100B shown in FIG. 1B to form the metal structures 210.

Figure 2B:
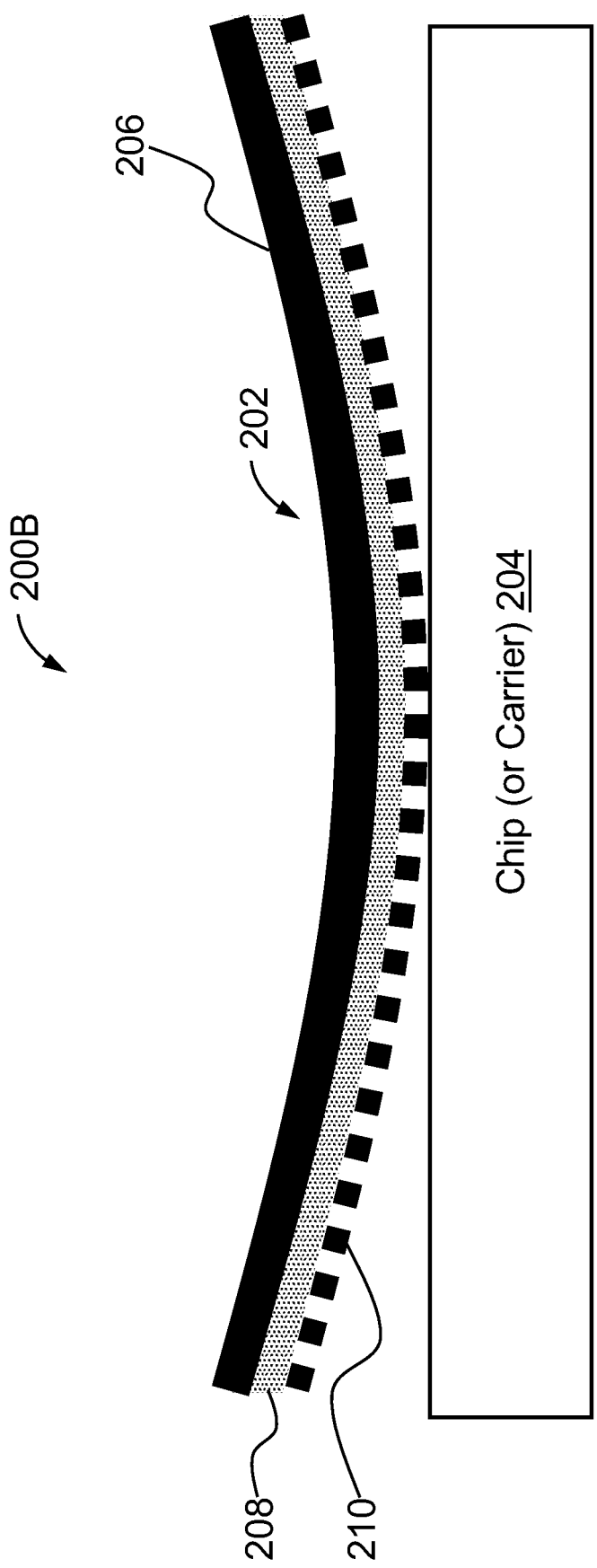
FIG. 2B is a schematic diagram of an example flip chip processing step.

FIG. 2B shows an example flip chip processing step 200B, after reflow soldering, where the first chip 202 is in contact with the second chip (or carrier) 204. In this example, the first chip 202 goes from a positive curvature before reflow soldering, to a negative curvature after reflow soldering. Due to such warpage, the resulting flip chip attachment can result in fewer than all of the metal structures 210 from making contact with the second chip (or carrier) 204, or in weak solder joints between the first chip 202 and the second chip (or carrier) 204. In a mass production scenario, applying a force on the first chip 202 during the reflow soldering process can be time consuming, since it may require individual processing of each chip rather than bulk processing of multiple chips in a tray that is located within a reflow furnace. The amount of curvature shown in this example is for illustrative purposes, and is not necessarily meant to be to scale.

Figure 3A:
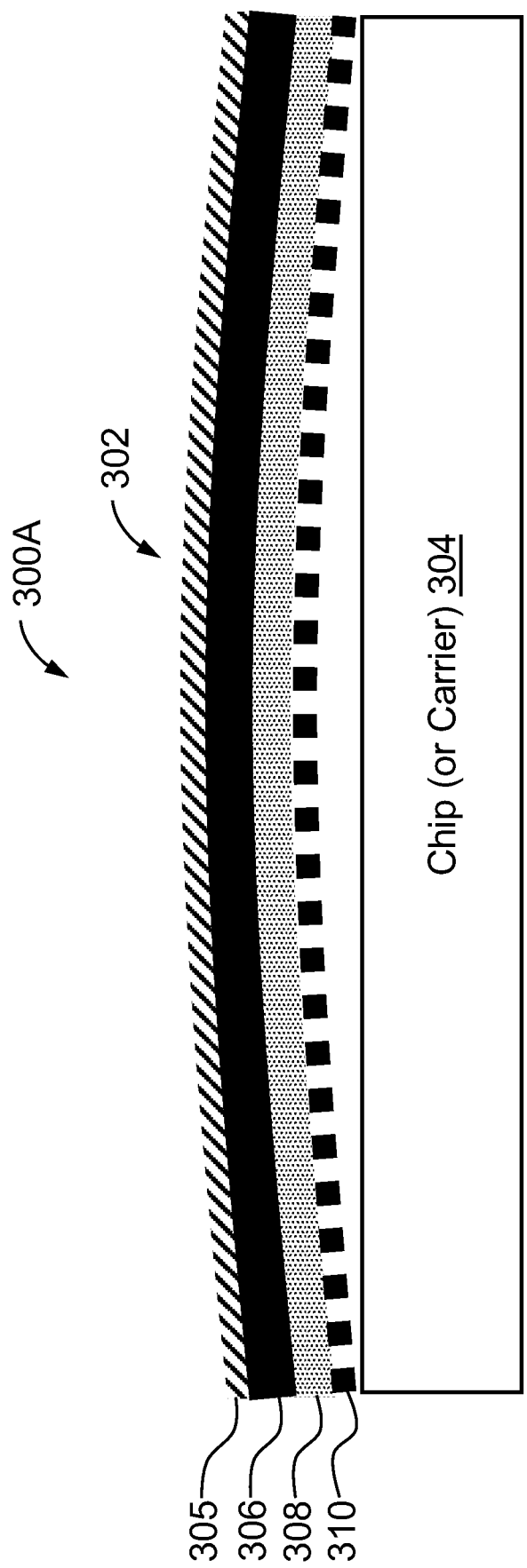
FIG. 3A is a schematic diagram of an example flip chip processing step.

FIG. 3A shows an example flip chip processing step 300A, prior to reflow soldering, where a first chip 302 is in contact with a second chip (or carrier) 304. The first chip 302 comprises BLs 305 (e.g., comprising one or more metal layers), a thinned first volume 306, a second volume 308, and metal structures 310. The first chip 302 may be formed, for example, by adding the BLs 305 and the metal structures 310 to the chip 100B shown in FIG. 1B. These steps may result in some change of the overall curvature of the first chip 302 such that any curvature will ultimately be reduced (or substantially removed) after final processing in later steps.

In some examples, BLs can be used to control an initial shape of a chip (e.g., before the chip undergoes reflow soldering or other temperature changes), as well as the thermal dependency of the shape (e.g., during reflow soldering). In examples where a first chip is being bonded to a second chip (e.g., as shown in FIG. 3B), BLs on the first chip or on the second chip can be used to enhance the amount of contact surface area between the first chip and the second chip during a change in temperature (e.g., during heating for reflow soldering) so as to increase the number and/or quality of the solder joints between the two chips.

Figure 3B:
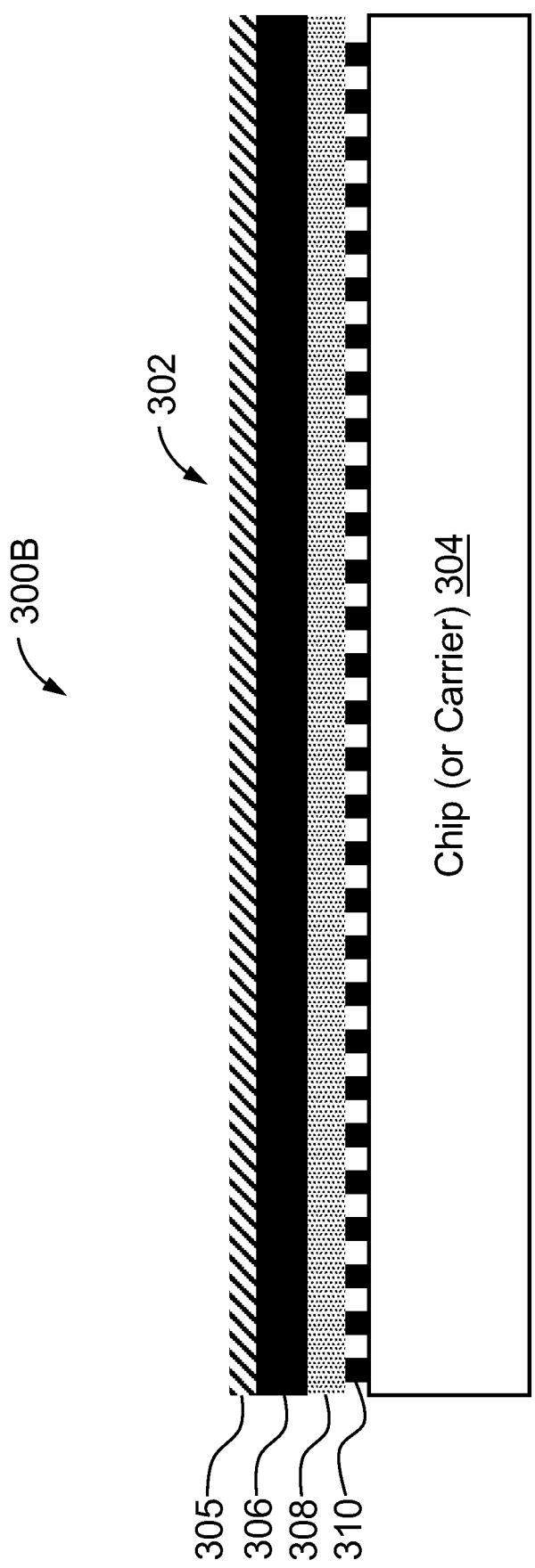
FIG. 3B is a schematic diagram of an example flip chip processing step.

FIG. 3B shows an example flip chip processing step 300B, after reflow soldering, where the first chip 302 is in contact with the second chip (or carrier) 304. In this example, the first chip 302 goes from a first curvature before reflow soldering, to a second curvature after reflow soldering, where the second curvature is less than the first curvature. In other examples, the second curvature may be larger than the first curvature, but still less than a third curvature that would be present in the first chip 302 if the BLs 305 were not present.

Referring again to FIGS. 3A and 3B, the BLs 305 can comprise one or more dielectric layers (e.g., composed of silicon dioxide or silicon nitride) and/or one or more metal layers (e.g., composed of gold, aluminum, palladium, platinum, silver, titanium, tantalum, chromium, or tungsten). In some examples, the patterning of the BLs 305 can be designed so as to compensate for stress that results from a thinning process or for stress that results from changes in temperature to the first chip 302. For example, the patterning of the BLs 305 can be designed so as to reduce the impact of thermal variations of the first chip 302 that can depend at least in part on electronic structures (not shown) or photonic structures (not shown) within the first chip 302. In the case of reflow soldering (e.g., in a flip chip attachment process), the temperature of the first chip 302 can range from room temperature (e.g., 20° C.) to 280° C., for example. Such changes in temperature can affect the shape and curvature of the first chip 302. In some examples, reflow soldering may be performed at temperatures as low as 150° C.

Figure 4:
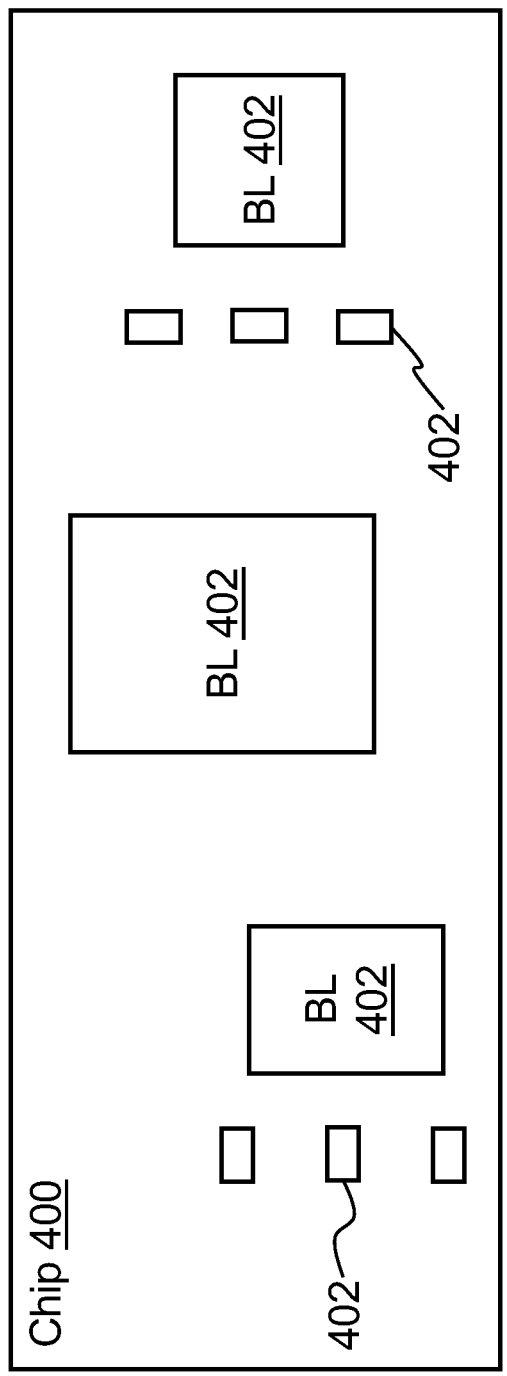
FIG. 4 is a schematic diagram of a top view of an example chip.

FIG. 4 shows a top view of an example chip 400 comprising numerous BLs 402. The design of the BLs 402 (e.g., the height, material, and location of each BL, the evaporation parameters, or the vertical arrangement of each BL to form a stack of BLs) can depend at least in part on the chip 400, an estimated change in temperature of the chip 400, and/or a fabrication process (e.g., flip chip attachment) of the chip 400. In some examples, the BLs 402 can be patterned to form fiducials that can be used to more accurately determine the position and orientation of the chip 400 for subsequent processes (e.g., passive alignment of free space optical elements). Without such fiducials, the subsequent traceability of the chip 400 and additional processing of the chip 400 may be more challenging.

FIGS. 5, 6, 7, and 8 each show various example chips that comprise BLs that can comprise metal layers, adhesion layers, and passivation layers (also referred to as dielectric layers). The BLs can be selected based on their material properties, such as their coefficient of thermal expansion (CTE), on which the stresses applied to the chip can depend upon. Furthermore, the vertical stack up of the BLs (e.g., their arrangement and their heights) can be used along with their CTE to manage the stress applied to the chip (e.g., before, during, or after the chip undergoes a change in temperature). For example, a first thickness of a metal layer in the set of BLs can be less than half a second thickness of the volume of the chip (e.g., so as to reduce the amount of metal added to the chip). In such examples, a first CTE of a metal layer in the set of BLs can be larger than a second CTE of a metal layer in the volume of the chip, such that the stress applied by the metal layer in the set of BLs counteracts the stress applied by the metal layer in the volume of the chip despite having a different thickness.

Referring again to FIGS. 5, 6, 7, and 8, in general, the BLs need not necessarily be electrically connected to other metal layers in the volume of the chip, or to metal structures on another surface of the chip. In some examples, the backside of the chip further is "active" and comprises one or more sensors (e.g., temperature sensors or stress sensors), one or more heating elements, and/or one or more piezoelectric crystals. For example, the one or more heating elements can control the temperature of the chip and can be based at least in part on one or more measurements from the one or more sensors. In other examples, the one or more piezoelectric crystals can be actively controlled (e.g., by a voltage) so as to modify the stress of the chip by changing the size of the piezoelectric crystal. The control signals transmitted to the piezoelectric crystals can be based at least in part on the one or more sensors. Thus, the stress of the chip can be modified by one or more heating elements and/or piezoelectric crystals, and the amount of stress modification can be based at least in part on one or more measurements from sensors. Such control over the stress of the chip can be used to control the shape (e.g., curvature) of the chip.

Figure 5:
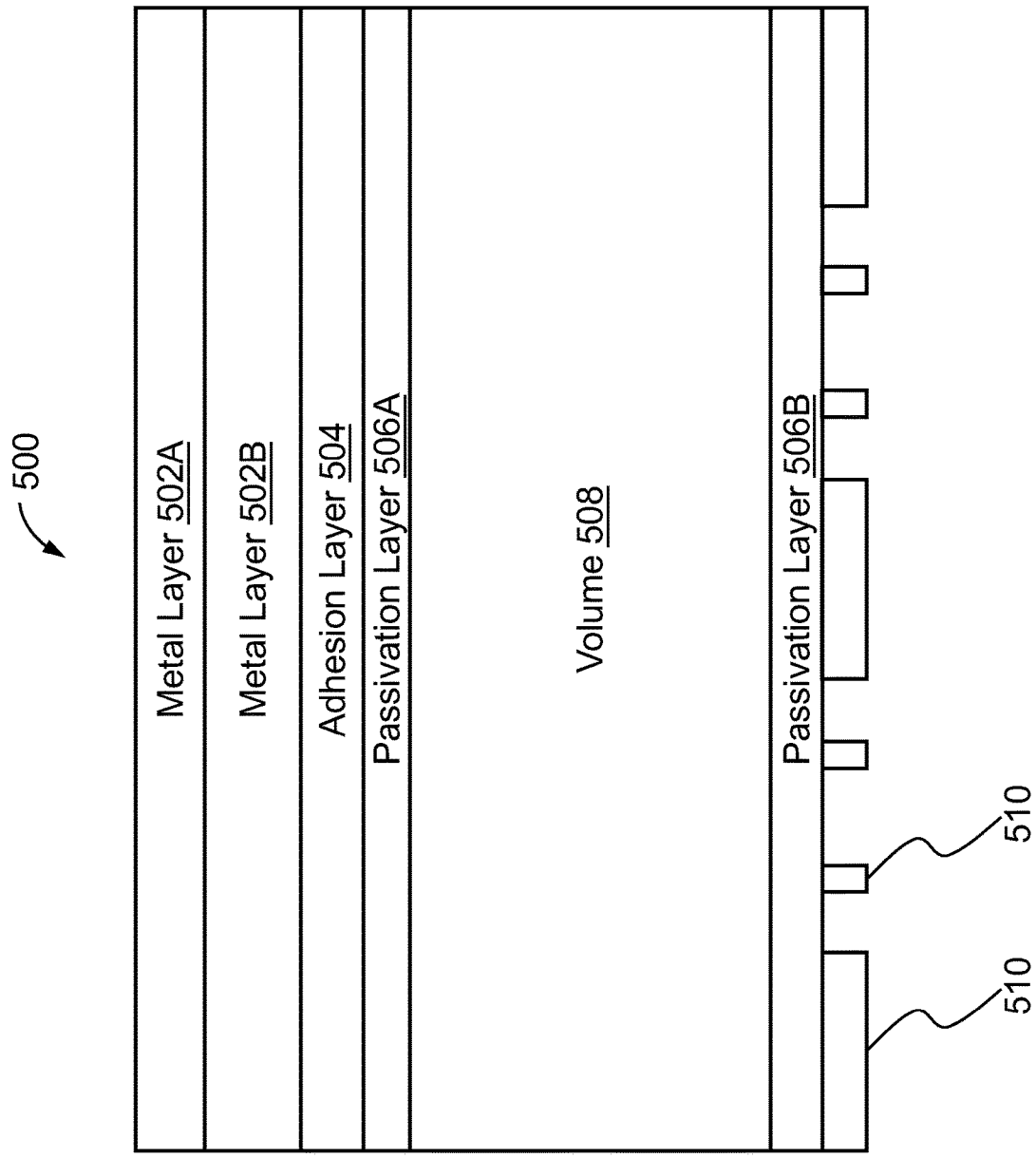
FIG. 5 is a schematic diagram of an example chip.

FIG. 5 shows an example chip 500 comprising a first metal layer 502A adjacent to a second metal layer 502B, where the first metal layer 502A and the second metal layer 502B are BLs and can be composed of different metals. An adhesion layer 504 is located between the second metal layer 502B and a first passivation layer 506A (e.g., composed of an oxide). The first passivation layer 506A is adjacent to a volume 508 (e.g., comprising silicon or indium phosphide) that can include electronic or photonic structures and/or metal layers (e.g., as part of an electro-optic modulator). A second passivation layer 506B is adjacent to the volume 508 and to a third metal layer 510.

Figure 6:
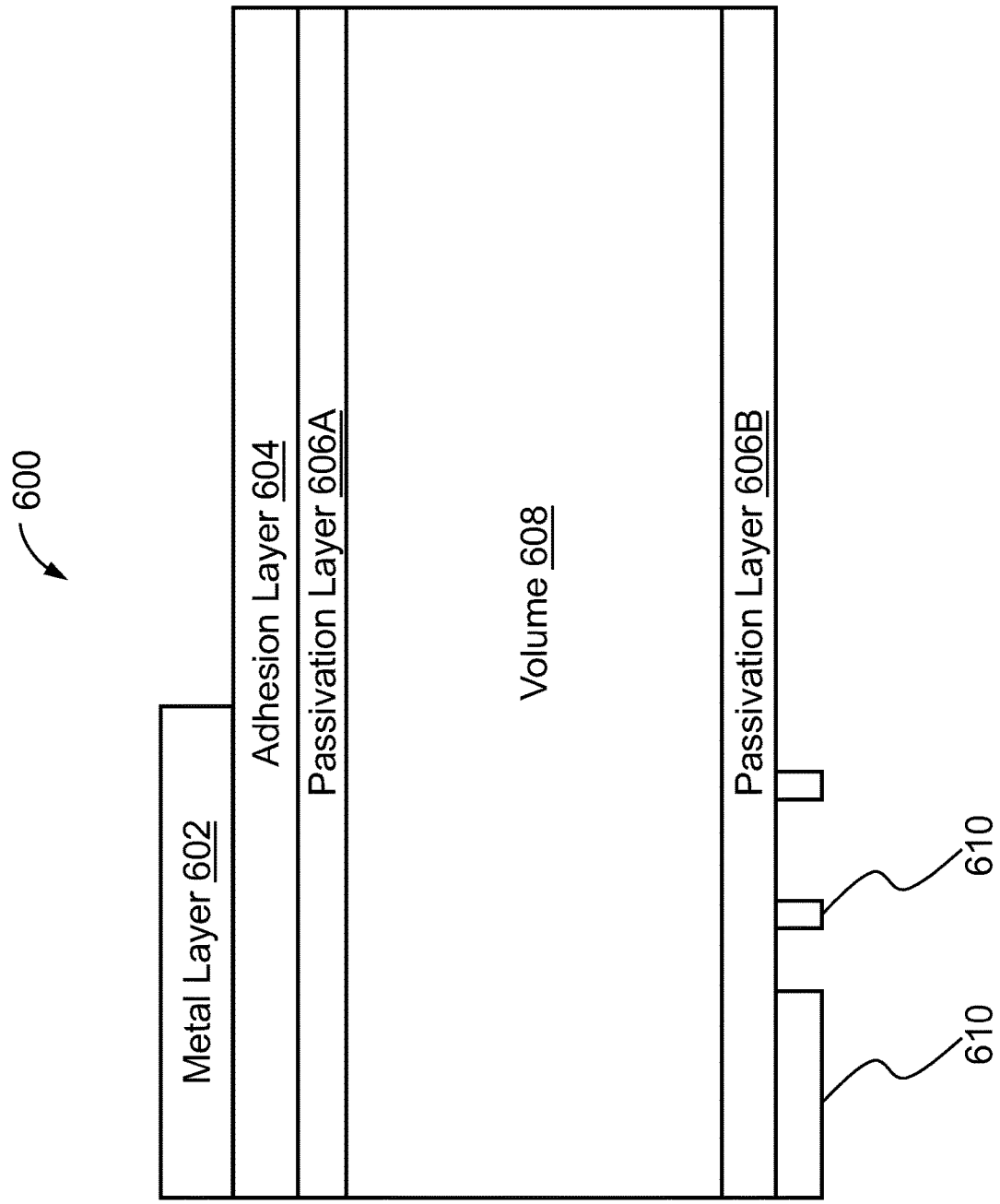
FIG. 6 is a schematic diagram of an example chip.

FIG. 6 shows an example chip 600 comprising a first metal layer 602 (a BL) adjacent to an adhesion layer 604. The adhesion layer 604 is adjacent to a first passivation layer 606A, and the first passivation layer 606A is adjacent to a volume 608 that can include electronic or photonic structures and/or additional metal layers. A second passivation layer 606B is adjacent to the volume 608 and to a second metal layer 610. In this example, the second metal layer 610 is asymmetrically distributed on the chip 600 such that only the left side of the chip 600 comprises the second metal layer 610. In order to compensate for the stress associated with the second metal layer 610, the first metal layer 602 is formed asymmetrically as well, such that the first metal layer 602 can counterbalance stresses imposed by the second metal layer 610.

Figure 7:
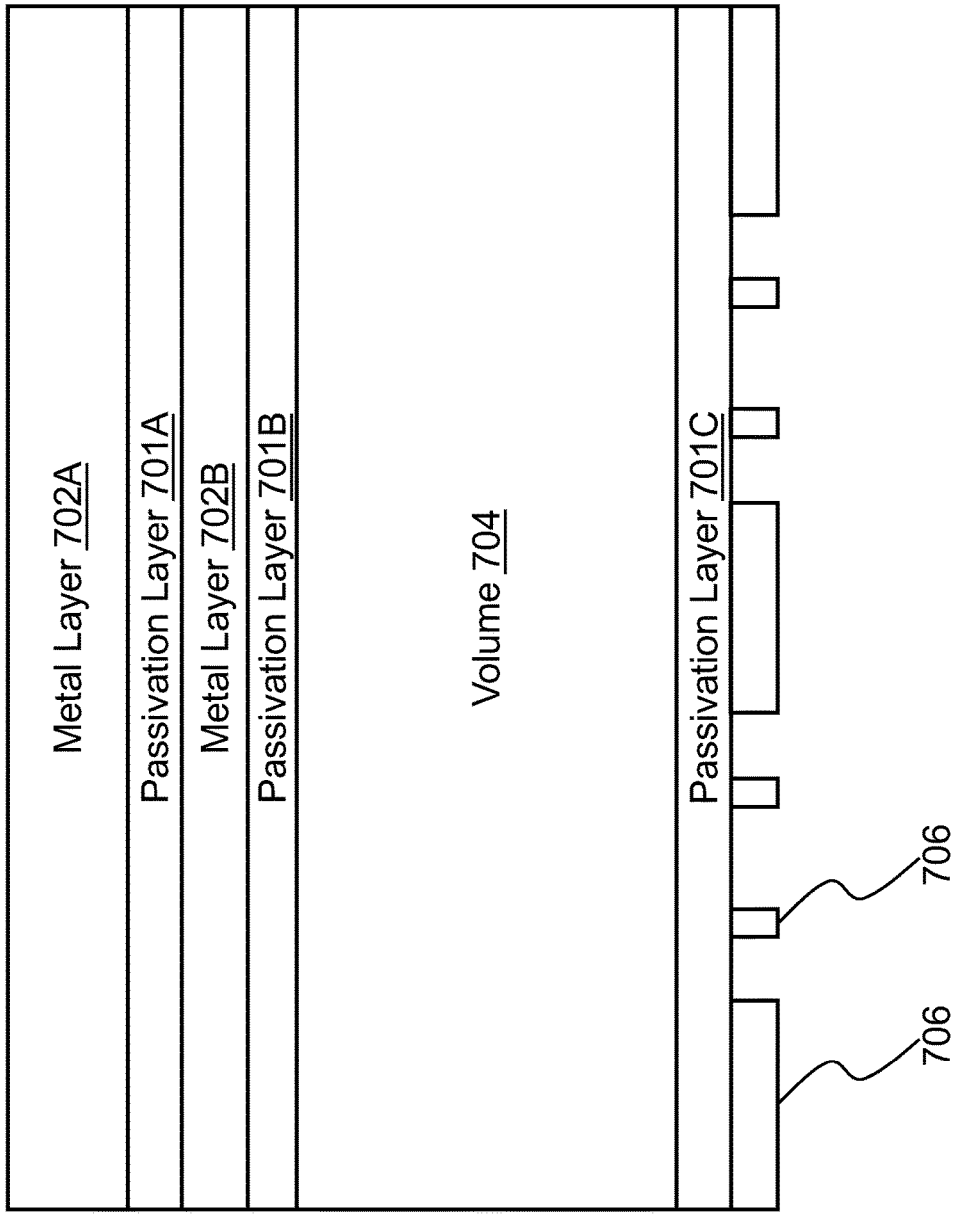
FIG. 7 is a schematic diagram of an example chip.

FIG. 7 shows an example chip 700 comprising a first passivation layer 701A located between a first metal layer 702A and a second metal layer 702B, all of which are BLs. A second passivation layer 701B is located between the second metal layer 702B and a volume 704. A third passivation layer 701C is located between the volume 704 and a third metal layer 706. In this example, the first passivation layer 701A separates the first metal layer 702A and the second metal layer 702B and can be designed to have a desired coefficient of thermal expansion (CTE) together with the other BLs (i.e., the first metal layer 702A, the second metal layer 702B, and the second passivation layer 701B).

Figure 8:
FIG. 8 is a schematic diagram of an example chip.

FIG. 8 shows an example chip 800 comprising a first set of one or more metal layers 802, where the first set of one or more metal layers 802 is characterized by a first thickness and comprises at least one metal layer that is characterized by a first coefficient of thermal expansion. The chip 800 further comprises a first volume 804A that is adjacent to the first set of one or more metal layers 802. The chip 800 further comprises a second volume 804B that comprises one or more electronic or photonic structures (not shown). The second volume 804B further comprises a second set of one or more metal layers (not shown) that is characterized by a second thickness that is at least twice as large as the first thickness, where at least one metal layer in the second set of one or more metal layers is characterized by a second coefficient of thermal expansion. The chip 800 further comprises a set of one or more metal structures 806 that is adjacent to the second volume 804B and comprises at least one metal structure that is electrically connected to at least a portion of at least one metal layer in the second set of one or more metal layers.

Referring again to FIG. 8, in some examples, the second volume 804B comprises the third passivation layer 701C and the third metal layer 706 shown in FIG. 7. In other examples, the second volume 804B comprises the second passivation layer 606B and the second metal layer 610 shown in FIG. 6. In other examples, the second volume 804B comprises the second passivation layer 506B and the third metal layer 510 shown in FIG. 5. In general, the second volume 804B may comprise one or more passivation layers (not shown) that are adjacent to the metal structures 806. In some examples, a first location of the first set of one or more metal layers 802 depends at least in part on a second location of the second set of one or more metal layers located in the second volume 804B. For example, the first set of one or more metal layers 802 may have reduced metal (or no metal) above locations where the second set of metal layers have metal. Such an arrangement can be used to reduce stray capacitance and/or interference (e.g., in an electro-optic modulator), particularly for sensitive devices or components.

Figure 9:
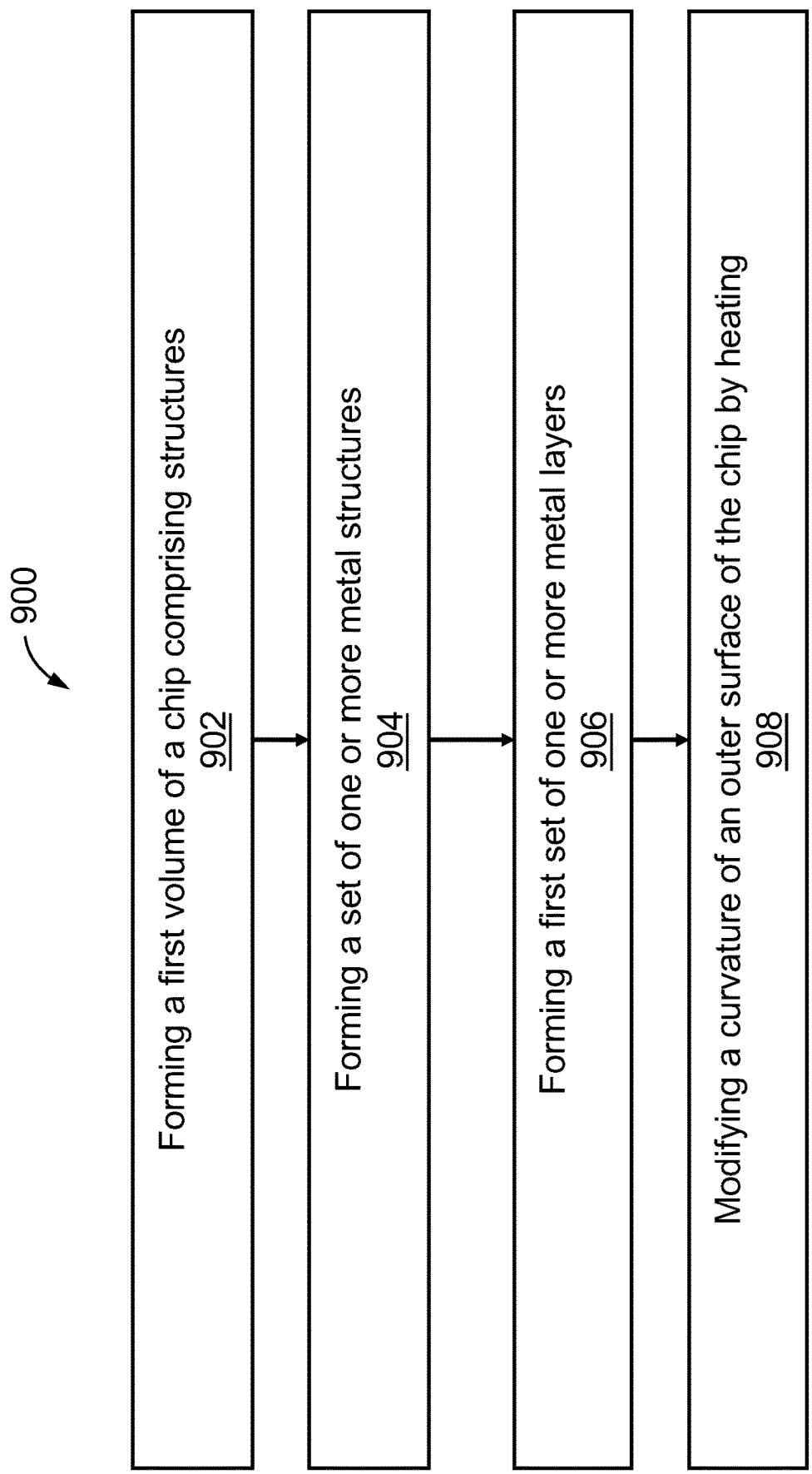
FIG. 9 is a flowchart of an example fabrication process for an example chip.

FIG. 9 shows a flowchart of an example fabrication process 900 comprising forming (902) a first volume of a chip comprising structures, the first volume of the chip being adjacent to a second volume of the chip, forming (904) a set of one or more metal structures of the chip, forming (906) a first set of one or more metal layers adjacent to the second volume of the chip, and modifying (908) a curvature of an outer surface of the chip. (The generic labels "first" and "second" do not necessarily imply any order in which the steps are performed.) The first set of one or more metal layers is characterized by a first thickness and comprises at least one metal layer that is characterized by a first coefficient of thermal expansion. The first volume comprises one or more electronic or photonic structures, and a second set of one or more metal layers that is characterized by a second thickness, where at least one metal layer in the second set of one or more metal layers is characterized by a second coefficient of thermal expansion. The set of one or more metal structures is adjacent to the first volume and comprises at least one metal structure that is electrically connected to at least a portion of at least one metal layer in the second set of one or more metal layers in the first volume. The curvature of an outer surface of the chip is modified (908) by heating at least a portion of the chip from a first temperature to a second temperature, and the modifying (908) of the curvature is based at least in part on the first coefficient of thermal expansion, the second coefficient of thermal expansion, and a temperature difference between the first temperature and the second temperature. In other example fabrication processes, the order of steps can be changed, and other steps can optionally be performed, such as thinning the chip when forming the second volume before forming (906) the first set of one more layers.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:
1. An apparatus comprising:
 a first set of one or more metal layers of a first chip, where the first set of one or more metal layers has a first thickness and comprises at least one metal layer that has a first coefficient of thermal expansion;

a first volume of the first chip, where the first volume is adjacent to the first set of one or more metal layers;

a second volume of the first chip, where the second volume comprises
one or more electronic or photonic structures, and
a second set of one or more metal layers that has a second thickness that is at least twice as large as the first thickness, where at least one metal layer in the second set of one or more metal layers has a second coefficient of thermal expansion; and a set of one or more metal structures of the first chip, where the set of one or more metal structures is adjacent to the second volume and comprises at least one metal structure that is electrically connected to at least a portion of at least one metal layer in the second set of one or more metal layers.

2. The apparatus of claim 1, where the second coefficient of thermal expansion is different from the first coefficient of thermal expansion.

3. The apparatus of claim 1, where the second coefficient of thermal expansion is no larger than half as large as the first coefficient of thermal expansion.

4. The apparatus of claim 1, where the electronic structures or photonic structures comprise at least one of a metallic waveguide, an optical waveguide, or a portion of an electro-optic device.

5. The apparatus of claim 1, further comprising one or more passivation layers or one or more adhesion layers located between the first set of one or more metal layers and the first volume.

6. The apparatus of claim 1, where at least one of (1) the first thickness or (2) the first coefficient of thermal expansion depends at least in part on at least one of (1) the second thickness or (2) the second coefficient of thermal expansion.

7. The apparatus of claim 1, where a first location of the first set of one or more metal layers depends at least in part on a second location of the second set of one or more metal layers.

8. The apparatus of claim 1, further comprising a second chip adjacent to the set of one or more metal structures and electrically connected to at least one metal structure in the set of one or more metal structures.

9. The apparatus of claim 8, where the second chip is electrically connected to at least one metal structure by electrically conductive solder.

10. The apparatus of claim 1, where the first volume comprises one or more materials including at least one semiconductor material.

11. The apparatus of claim 1, where the first set of one or more metal layers is electrically isolated from the second set of one or more metal layers and from the set of one or more metal structures.

12. A method comprising:
forming a first set of one or more metal layers physically contacting a first volume of a first chip, where the first set of one or more metal layers has a first thickness and comprises at least one metal layer that has a first coefficient of thermal expansion;

forming a second volume of the first chip, where the second volume comprises
one or more electronic or photonic structures, and
a second set of one or more metal layers that has a second thickness, where at least one metal layer in the second set of one or more metal layers has a second coefficient of thermal expansion; and forming a set of one or more metal structures of the first chip, where the set of one or more metal structures is physically contacting the second volume and comprises at least one metal structure that is electrically connected to at least a portion of at least one metal layer in the second set of one or more metal layers.

13. The method of claim 12, further comprising modifying a curvature of an outer surface of the first chip by heating at least a portion of the first chip from a first temperature to a second temperature, where the modifying of the curvature is based at least in part on the first coefficient of thermal expansion, the second coefficient of thermal expansion, and a temperature difference between the first temperature and the second temperature.

14. The method of claim 13, where the second temperature is greater than or equal to 50 degrees Celsius.

15. The method of claim 13, where the second temperature is greater than or equal to 200 degrees Celsius.

16. The method of claim 13, where the first chip has a first curvature at the first temperature and has a second curvature at the second temperature, and the second curvature is smaller in magnitude than the first curvature.

17. The method of claim 13, further comprising
applying electrically conductive solder to at least one of (1) a portion of the set of one or more metal structures or (2) a portion of an outer surface of a second chip; and
placing a portion of the set of one or more metal structures of the first chip in contact with a portion of an outer surface of the second chip.

18. The method of claim 17, where the second temperature is based at least in part on a melting point of the electrically conductive solder.

19. The method of claim 17, where a first contact surface area between the first chip and the second chip before the heating is less than a second contact surface area between the first chip and the second chip after the heating.

20. The method of claim 12, further comprising performing backside grinding to form the first volume after forming the second volume.

* * * * *